(12) United States Patent
Ishikawa et al.

(10) Patent No.: US 7,944,767 B2
(45) Date of Patent: May 17, 2011

(54) SEMICONDUCTOR DEVICE AND DATA PROCESSING SYSTEM

(75) Inventors: Toru Ishikawa, Chuo-ku (JP); Sachiko Kamisaki, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 146 days.

(21) Appl. No.: 12/488,086

(22) Filed: Jun. 19, 2009

(65) Prior Publication Data

US 2009/0316510 A1 Dec. 24, 2009

(30) Foreign Application Priority Data

Jun. 23, 2008 (JP) ................................. 2008-162799

(51) Int. Cl.
*G11C 7/00* (2006.01)
*G11C 7/10* (2006.01)

(52) U.S. Cl. .............. 365/219; 365/189.03; 365/189.17; 365/201; 365/221

(58) Field of Classification Search .................... 365/219
See application file for complete search history.

(56) References Cited

U.S. PATENT DOCUMENTS

| 5,068,783 A  * | 11/1991 | Tanagawa et al. .............. 714/27 |
| 7,475,316 B2 * | 1/2009 | Cowell et al. ................. 714/734 |
| 7,567,476 B2 * | 7/2009 | Ishikawa ....................... 365/219 |
| 2006/0233035 A1 | 10/2006 | Ishikawa | |

FOREIGN PATENT DOCUMENTS

JP   2006-277872 A   10/2006

OTHER PUBLICATIONS

Perego, R., "Architectural Considerations for Next-Generation Memory Systems," Nov. 28, 2007, pp. 1-6, Rambus Development Forum.

* cited by examiner

*Primary Examiner* — Son L Mai
(74) *Attorney, Agent, or Firm* — Sughrue Mion, PLLC

(57) ABSTRACT

Control information needed for executing data transmission/reception through a data terminal is received via its own control terminal in a first operation mode, and the control information is received by using the own control terminal and also a control terminal of at least one of the other ports in a second operation mode.

15 Claims, 9 Drawing Sheets

SEMICONDUCTOR DEVICE AND DATA PROCESSING SYSTEM

BACKGROUND OF THE INVENTION

1. Field of the Invention

The present invention relates to a semiconductor device and a data processing system, and, more particularly relates to a semiconductor device and a data processing system to which at least one portion of all bits of control information (for example, information about a command, an address, or the like) used for data communication is serially transferred.

2. Description of Related Art

As a representative type of this kind of semiconductor devices, synchronous semiconductor memory (memory device) is well known. Such a semiconductor memory serially receives a command or control information as address information from an external device such as a controller and a CPU, serially returns data to the external device in a data read operation, and receives data serially sent from an external device in a data write operation.

Meanwhile, data transfer speed is becoming increasingly faster in the recent years, and along with the trend, the speed of a tester that checks operations of a semiconductor memory needs to be accelerated. However, the operation speed of testers has not been as good as that of semiconductor memories, and even if they are provided with a faster operation speed, the cost will be very expensive.

Japanese Patent Application Laid-open No. 2006-277872 (hereinafter called "patent document 1") discloses a technique in which a test using a low-speed tester is performed on a synchronous semiconductor memory that performs a high-speed data transfer.

By the technique disclosed in the patent document 1, data to be communicated at a speed corresponding to an internal clock speed of a semiconductor memory (that is, a data transfer speed inside the semiconductor memory) can be supplied and received by a tester operated at a lower speed than the speed of the semiconductor memory.

As a development of the synchronous semiconductor memory, there has been proposed a multiport semiconductor memory including a plurality of ports, to and from which data can be independently read and written. In such a semiconductor memory, as disclosed in "Architectural Considerations for Next-Generation Memory Systems (Rambus Develop Forum, Nov. 28, 2007)" (hereinafter called "non-patent document 1"), specifications in which a transfer speed of control information of a command/address system is accelerated as fast as a data transfer speed are considered.

However, the patent document 1 is not at all concerned with a case that the information transfer speed of the command/address system is accelerated as fast as the data transfer speed, as described in the non-patent document 1. Further, the technique disclosed in the patent document 1 cannot deal with the acceleration of the data transfer speed in practice.

SUMMARY OF THE INVENTION

The present invention seeks to solve one or more of the above problems, or to improve upon those problems at least in part.

In one embodiment, there is provided a semiconductor device includes a plurality of ports each of which has a control terminal and a data terminal such as a command or an address and can independently transmit and receive data via the data terminal. In a first operation mode, each of the ports receives control information needed for executing data transmission/reception through the data terminal, via its own control terminal, and in a second operation mode, each of the ports receives the control information by using the own control terminal and also a control terminal of at least one of the other ports.

As described above, in the second operation mode, at least two control terminals are used to receive the control information needed for the data transfer, and consequently, a transmission speed of the control information can be delayed. Accordingly, when the second operation mode is started at the time of a test operation, the semiconductor device can be tested by using a low-speed tester. For the test on the data terminal, the technique disclosed in the patent document 1 can be adopted.

When the control information supplied via a plurality of control terminals is configured to be fetched commonly to the respective ports in the second operation mode, the control information is fetched to these ports in parallel. Thus, transmission and reception of data via the data terminal at each port can be also executed in parallel. Needless to say, it is not necessary to fetch the data in parallel. In this case, it is necessary to separately select a port to which the control information is fetched.

Further, the second operation mode is not limited to test operations, and can be also used in normal operations. As a result, great expandability and convenience can be achieved for an external device (for example, a memory controller or a CPU) that drives the semiconductor device and a system thereof.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Constituent elements in the embodiments can be replaced by existing constituent elements or the like as appropriate. In addition, various variations including combinations with other existing constituent elements can be made. Thus, the descriptions of the embodiments do not limit the scope of the present invention according to the appended claims.

First Embodiment

Figure 1:
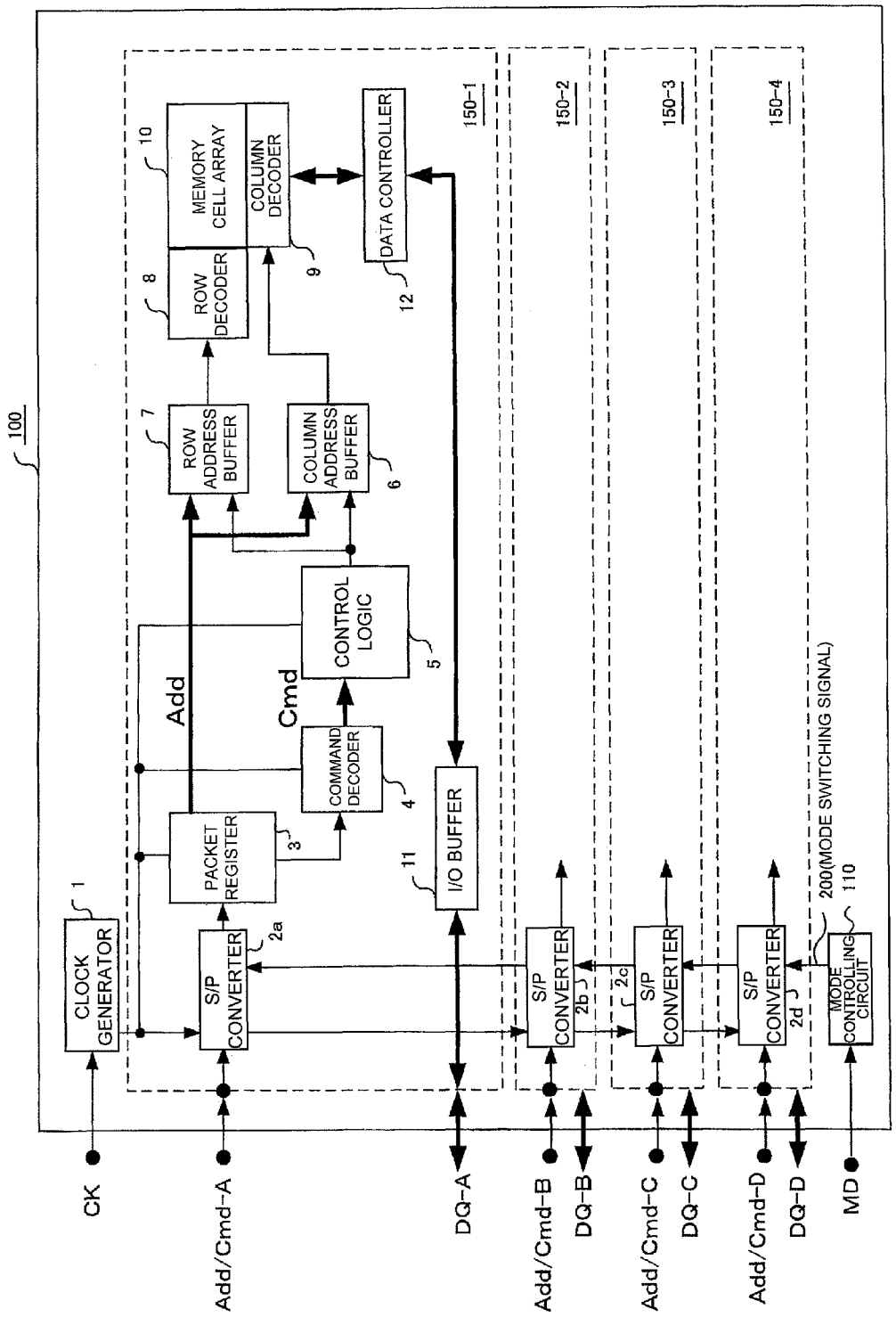
FIG. 1 is a schematic configuration diagram of a semiconductor device according to a first embodiment of the present invention.

A semiconductor device according to a first embodiment of the present invention is shown as a semiconductor memory 100 in FIG. 1. The semiconductor memory 100 includes four ports 150-1 to 150-4 each of which can independently execute reading/writing of data. The semiconductor memory 100 further includes a clock generator 1 that receives a clock signal from a clock terminal CK and supplies a desired timing signal to each port 150, and a mode controlling circuit 110 that receives a mode signal from a mode signal terminal MD and generates an operation-mode switching signal 200 (hereinafter, "mode switching signal 200"). The four ports 150-1 to 150-4 have the same configuration to each other. Accordingly, the port 150-1 is mainly described below.

The port 150-1 includes an S/P (Serial/Parallel) converter 2a that serially receives control information from an Add/Cmd-A terminal, a packet register 3, a command decoder 4, a control logic 5, a column address buffer 6, a row address buffer 7, a row decoder 8, a column decoder 9, a memory cell array 10, an I/O buffer 11 connected to a data terminal DQ-A, and a data controller 12. The S/P converter 2a, the packet register 3, the command decoder 4, and the control logic 5 operate synchronously with an internal clock signal from the clock generator 1.

The S/P converter 2a (the same applies to the S/P converters 2b, 2c, and 2d in the other ports 150-2 to 150-4. Hereinafter, when generally describing the S/P converters, it will be simply denoted as the S/P converter 2) converts into a parallel format a data group relating to a serially-formatted command/address signal inputted from the corresponding command/address signal input terminal Add/Cmd-A. As described later, the conversion operation is controlled by the mode switching signal 200.

That is, each S/P converter 2 fetches all the data group relating to the inputted serially-formatted command/address signal according to the internal clock, when an operation mode by the mode switching signal 200 is a normal operation mode designated as a first operation mode. On the other hand, when the operation mode by the mode switching signal 200 is designated as a second operation mode such as a test mode, one valid bit is taken out from the data group relating to the inputted serially-formatted command/address signal, and that bit is outputted.

The packet register 3 temporality stores the bit information outputted from the S/P converter 2, and produces a command/address packet (that is, control information) as command/address information from the stored bit information. Address data obtained from the produced command/address packet is outputted to the column address buffer 6 and the row address buffer 7, and also command data is outputted to the command decoder 4.

The command decoder 4 decodes the command data inputted from the packet register 3, and outputs the decoded information to the control logic 5.

According to a content of the inputted command data, the control logic 5 outputs the instruction to the column address buffer 6 and the row address buffer 7.

The column address buffer 6 temporarily stores the address data inputted from the packet register 3 and the instruction inputted from the control logic 5, and thereafter outputs them to the column decoder 9.

The row address buffer 7 temporarily stores the address data inputted from the packet register 3 and the instruction inputted from the control logic 5, and thereafter outputs them to the row decoder 8.

The row decoder 8 executes the instruction on the relevant cell within the memory cell array 10, based on the address data inputted from the row address buffer 7.

The column decoder 9 executes the instruction on the relevant cell within the memory cell array 10, based on the address data inputted from the column address buffer 6.

The memory cell array 10 is a memory device in which a plurality memory cells configured by transistors and condensers arranged at intersections between word lines and bit lines, for example, are combined in an array. In the memory cell array 10, a specific memory cell is selected by the word line, and reading or writing data from and to the bit line is executed. In the memory cell array 10 of the first embodiment, peripheral circuits such as a sense amplifier are included.

The I/O buffer 11 is a memory device in which the inputted or outputted data is temporarily stored. The data controller 12 controls the column decoder 9 to write or read the data. Transmission and reception of read data and write data are performed via a data terminal DQ. In the first embodiment, the data is read or written in a 1-bit unit (×1). However, the data can be read or written in other-bit units, such as ×4 or ×8. Data communication via each data terminal DQ is serially performed.

Figure 2:
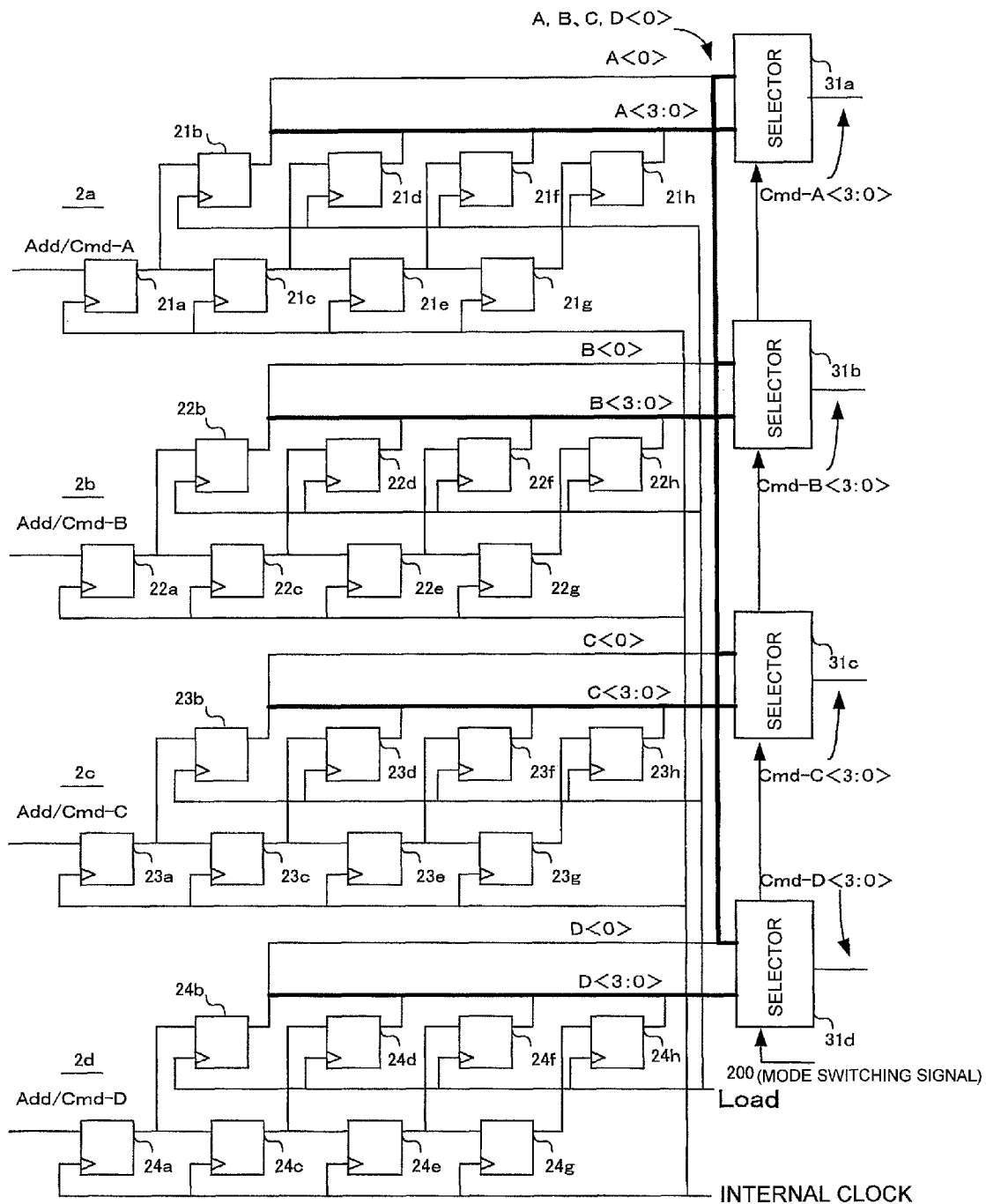
FIG. 2 is an internal configuration diagram of an S/P converter according to the first embodiment.

With reference to FIG. 2, the S/P converter 2a according to the first embodiment includes registers 21a to 21h and a selector 31a, the S/P converter 2b includes registers 22a to 22h and a selector 31b, the S/P converter 2c includes registers 23a to 23h and a selector 31c, and the S/P converter 2d includes registers 24a to 24h and a selector 31d.

Taking the S/P converter 2a as an example, the information of the address/command terminal Add/Cmd-A is sequentially fetched to the registers 21a, 21c, 21e, and 21g and shifted. The information is fetched in parallel to the registers 21b, 21d, 21f, and 21h at each time an internal load signal Load is generated.

Out of the 4-bit information, the information of the register 21b is supplied as A<0> to one input terminal of the selector 31a, and all-bit information including the register 21b is supplied as A<3:0> to the other input terminal of the selector 31a. To the one input terminal of the selector 31a, information B<0>, C<0>, and D<0> from the registers 22b, 23b, and 24b within the S/P converters 2b, 2c, and 2d are also supplied.

To the selector 31a, the mode switching signal 200 is supplied, and when that signal is a high level for example, as the first operation mode, the selector 31a selects the information A<3:0> of the other input terminal. On the other hand, when the mode signal is a low level for example, as the second operation mode, the selector 31a selects and outputs the information A, B, C, D<0> of the one input terminal. Other selectors also select the input information according to the same relation.

As described above, in the first operation mode, each output of the selectors 31a to 31d corresponds to the 4-bit information serially inputted from each Add/Cmd terminal. Meanwhile, in the second operation mode, each output of the selectors 31a to 31d corresponds to the 4-bit information supplied in parallel to the four Add/Cmd terminals at the four ports 150.

Figure 3A:
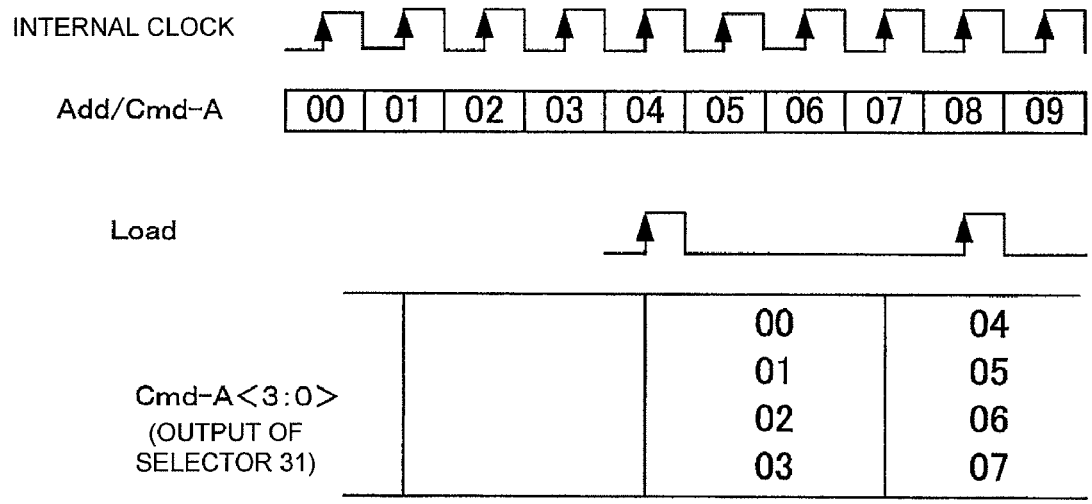
FIG. 3 shows a process operation of the S/P converter according to the first embodiment.

That is, in the first operation mode, as shown in FIG. 3A, as the port 150-1 is focused, the control information is supplied in order from bit 00 by one bit to the Add/Cmd-A terminal at a predetermined timing. The internal clock from the clock generator 1 synchronizes with that timing, and thus the bit information 03 to 00 are fetched to the registers 21a, 21c, 21e, and 21g, respectively, based on a rising edge of a fourth internal clock.

These pieces of information are fetched to the registers 21b, 21d, 21f, and 21h, respectively, in synchronism with the load signal Load generated together with the rising edge of a fifth internal clock. As a result, by the mode switching signal 200, the selector 31a selects the A<3:0> side as the first operation mode. Thus, the output Cmd-A<3:0> is bit information 00, 01, 02, and 03. Similarly, when a second load signal Load is applied, the output Cmd-A<3:0> of the selector 31a is bit information 04, 05, 06, and 07.

On the other hand, when the second operation mode is designated by the mode switching signal 200, each of the selectors 31a to 31d selects the registers 21b, 22b, 23b, and 24b so that mutually the same control information is established. However, the internal clock itself from the clock generator 1 is not changed.

Accordingly, the information supplied in parallel to the Add/Cmd terminals at the ports 150-1 to 150-4 can be used as the common control information to each port. As a result, it suffices to change the control information to the Add/Cmd terminal of each port 150 in a cycle that is equivalent to four cycles of the internal clock.

Figure 3B:
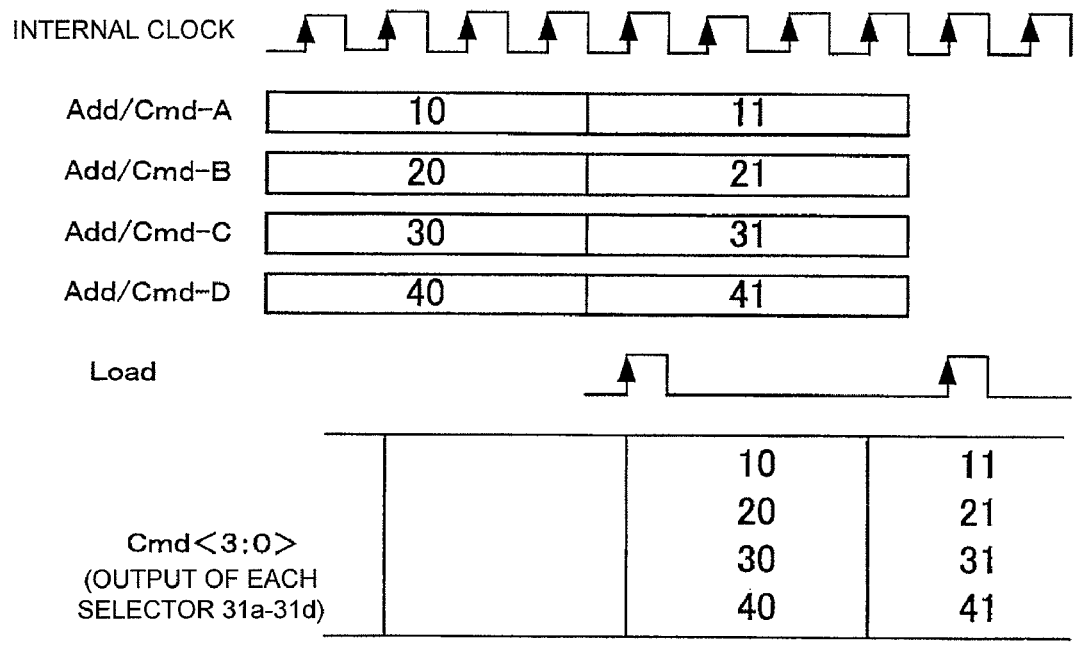

In this way, a timing chart relating to fetching of the control information in the second operation mode is as shown in FIG. 3B. That is, it suffices that the control information in the second operation mode changes in a cycle that is equivalent to four cycles of the internal clock.

Thus, the S/P conversion circuits and the packet registers at each port 150 are input circuits that generate operation controlling information (command/address information) from the information supplied to the Add/Cmd terminal as a serial port, and include the first operation mode in which the information appearing at the serial port in a first cycle is treated as valid information to generate the operation controlling information and the second operation mode in which the information appearing at the serial port in a second cycle different from the first cycle is treated as the valid information to generate the operation controlling information.

The input circuit is connected with temporary memory devices (which are the registers 21a to 21h, in the S/P converter 2a) corresponding to the number of bits inputted to the serial port. The first cycle is a cycle in which the information is sequentially stored in the temporary memory devices in synchronism with the internal clock, and in a subsequent internal clock in which the information is stored in all of the temporary memory devices, all of the information stored in the temporary memory devices are fetched as valid information (that is, the first cycle is the same cycle as the internal clock). The second cycle is a cycle in which in the subsequent internal clock in which the information is stored in all of the temporary memory devices, out of the information stored in the temporary memory devices, at least one piece of information is fetched as the valid information (that is, the second cycle is ¼ cycle of the internal clock)

Figure 4:
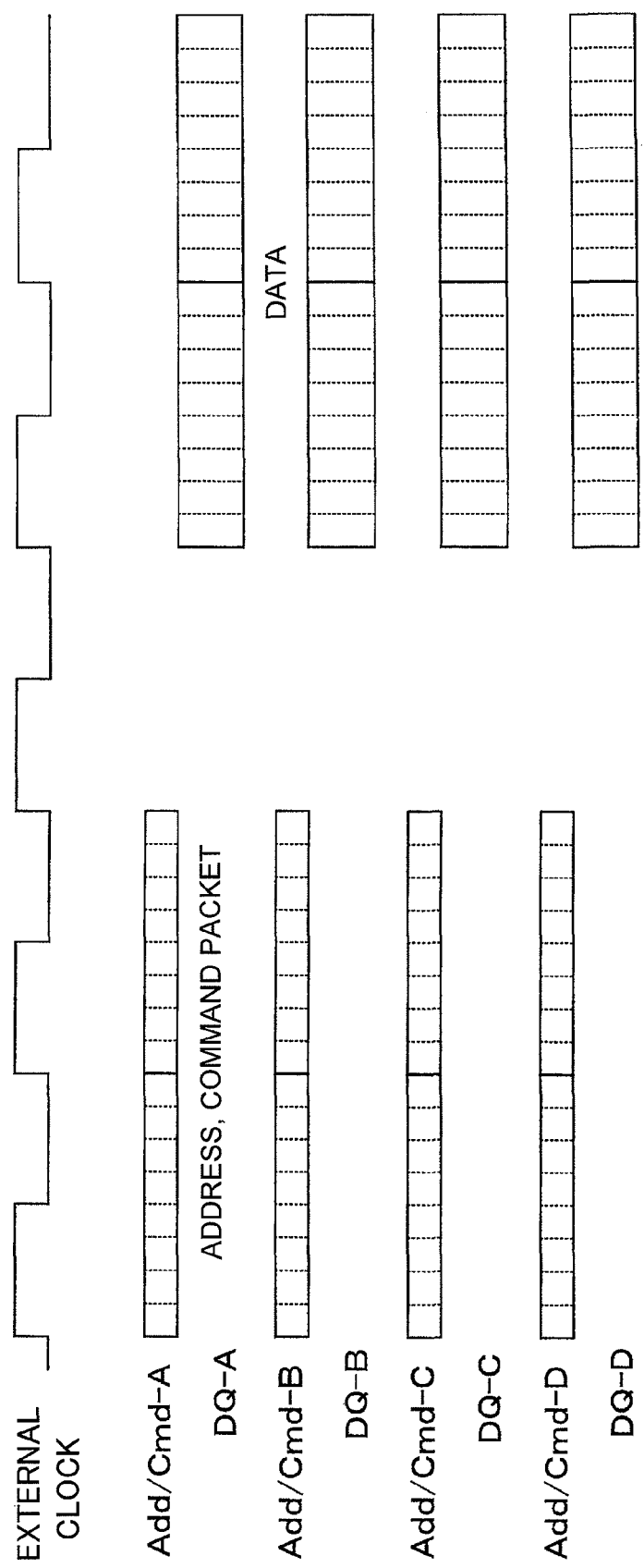
FIG. 4 shows a process operation at the time of a normal operation mode in a semiconductor memory device according to the first embodiment.

In the first embodiment, in the control information composed of the address/command, 16 bits correspond to one packet. However, the present invention is not limited thereto. Accordingly, as shown in FIG. 4, in the first operation mode, the Add/Cmd terminals from the ports 150-1 to 150-4 are serially supplied with the control information independently of each other (each 16 bits is one packet). The transfer speed is eight bits per each cycle of the clock supplied from outside to the clock terminal CK (that is, the transfer speed is eight times faster than that of the external clock), and inside, an 8-time internal clock is generated by the clock generator 1 by using a well-known DLL circuit or the like, and supplied to the S/P converters 2a to 2d.

In response to such control information, from the data terminal DQ at each port 150, 16-bit data (as one unit) is serially transferred (read/written). This transfer speed is also eight times faster than that of the external clock CK. In this case, the control information can be set independently of each other at each port, and thus the data read or write can be designated for each port.

Figure 5:
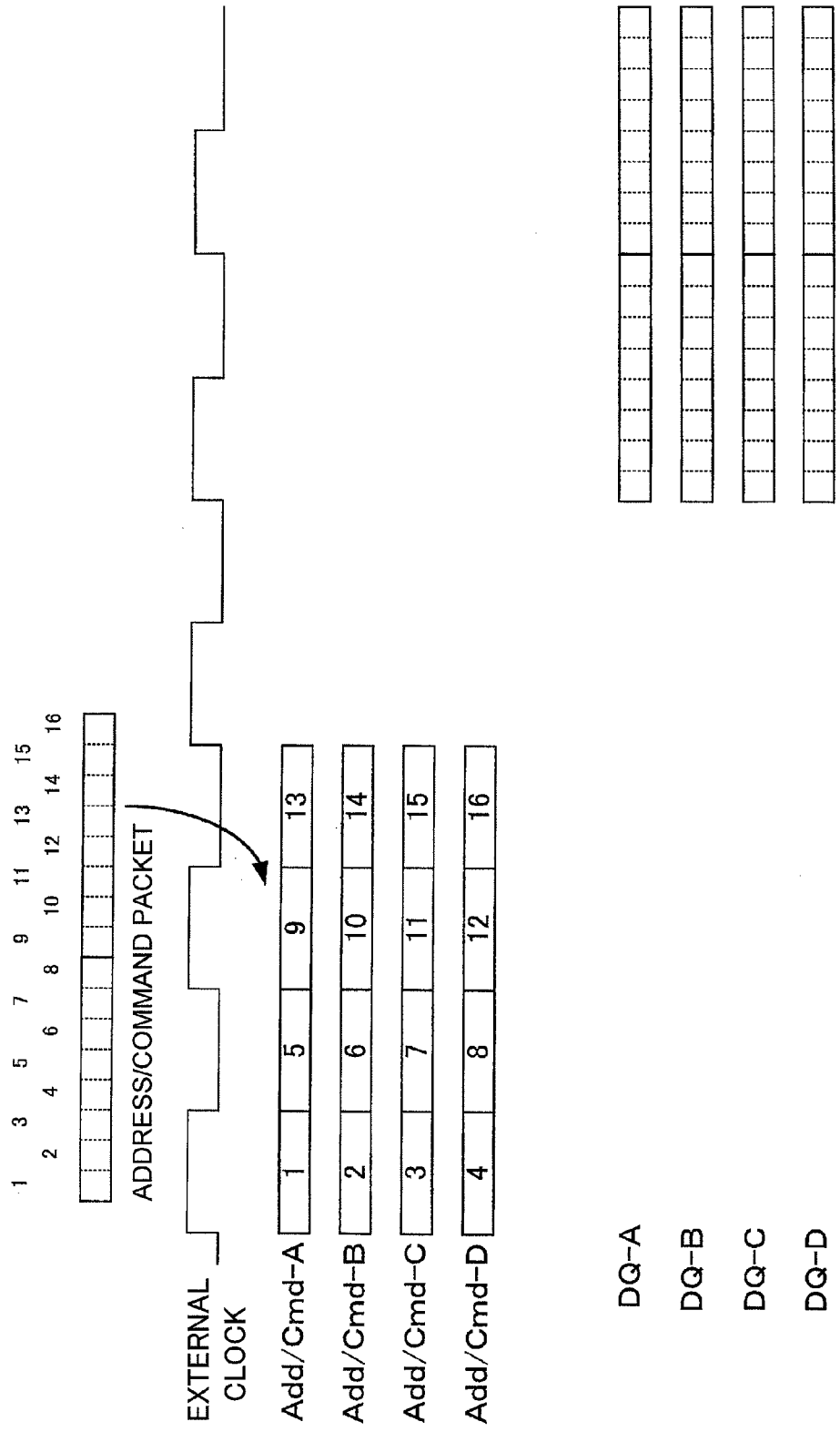
FIG. 5 shows a process operation at the time of a test mode in the semiconductor memory device according to the first embodiment.

On the other hand, in the second operation mode, as shown in FIG. 5, it suffices to change the control information in the Add/Cmd terminal at each port 150 at a speed two times faster than that of the external clock CK. Accordingly, receiving the 16-bit control information needed as one packet is completed in two cycles of the external clock CK in the same way as FIG. 4, and there is no difference from the first operation mode. However, at each port 150, the same control information is supplied by one address/command packet (bit 0 to bit 15), one of the data read and the data write is designated for the same address of each port 150, and the 16-bit-unit data is transferred at a speed eight times faster than that of the external clock CK.

Thus, the semiconductor device includes ports 150-1 to 150-4 each of which has a control (Add/Cmd) terminal and a data (DQ) terminal. In the first operation mode, each of the ports receives the control information needed for executing data transmission/reception through the data terminal, via its own control terminal, while in the second operation mode, each of these receives the control information by using the own control terminal and also a control terminal of at least one of the other ports.

Further, in the second operation mode, from the data group relating to the control information received by using its own control terminal and also a control terminal of at least one of the other ports, only valid information is fetched. By combining these pieces of the valid information, the control information is generated.

In the first embodiment, all of the serial ports are utilized. However, it is obvious that when the number of serial ports is two or more, the transfer speed of the control information is decreased corresponding to the number of serial ports. Further, such a configuration can be easily realized by controlling the bit information selected by the selectors 31a to 31d in the second operation mode.

Accordingly, when the second operation mode is used for a test operation, a tester of which the speed is lower than the operation speed of the semiconductor memory can be used for performing a test.

Figure 6:
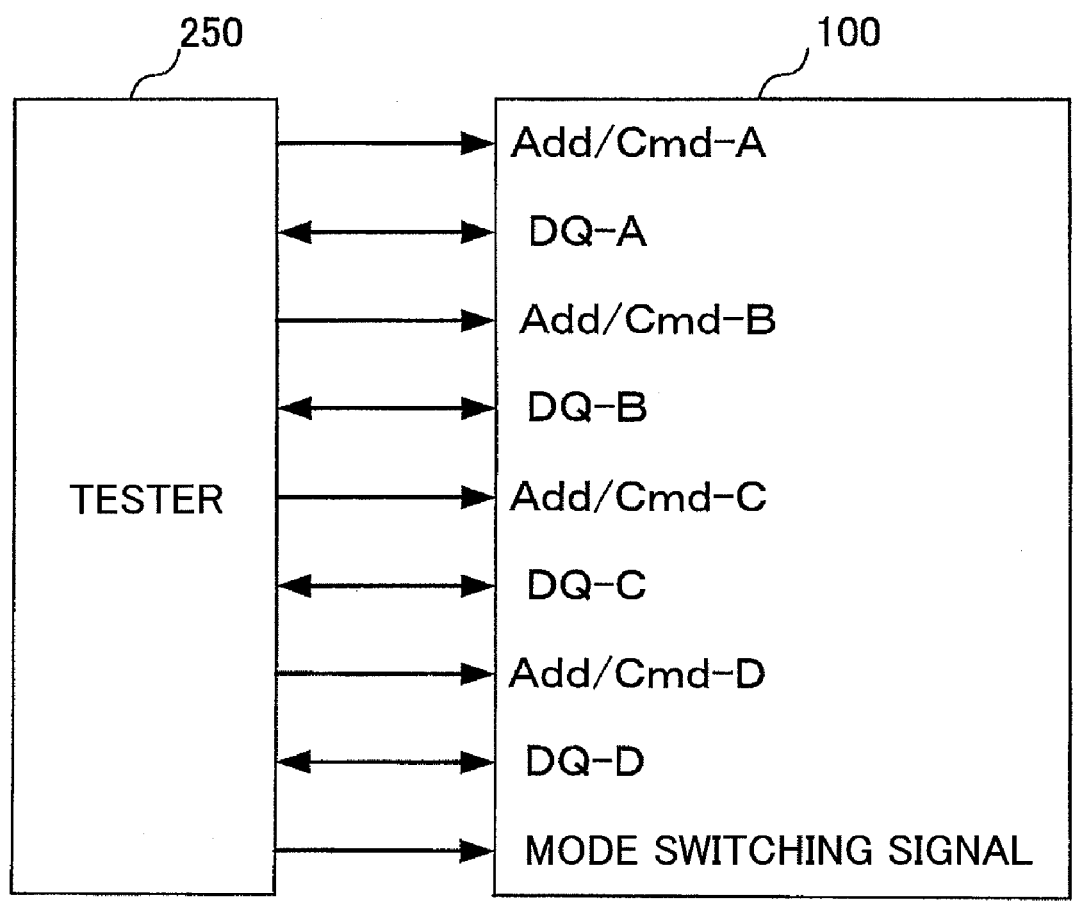
FIG. 6 shows a system configuration at the time of the test mode according to the first embodiment.

That is, when testing the semiconductor memory 100 shown in FIG. 1, the semiconductor memory 100 is connected to a tester 250, as shown in FIG. 6. In the test, the tester 250 first supplies a mode switching signal to the semiconductor memory 100 to designate the second operation mode. In this state, according to a timing chart in FIG. 5, the tester 250 supplies the control information to the semiconductor memory 100. The speed is two times faster than that of the external clock, and the speed is ¼ of the internal clock of the semiconductor memory 100.

The data reading/writing can be executed by the technique in the patent document 1, even when the actual transfer speed between the tester 250 and the semiconductor memory 100 is the same as the transfer speed of the control information, without changing the clock rate as such relating to the data reading/writing within the semiconductor memory 100.

As described above, by using the second operation mode of the semiconductor memory of the first embodiment as a test mode to input the original command/address information (command/address packet) to the four command/address signal input terminals, inside the semiconductor memory, the operation is performed by the normal clock. Also, only the input frequency of the command/address signal is decelerated to ¼, and the test can be performed in this state.

Second Embodiment

Figure 7:
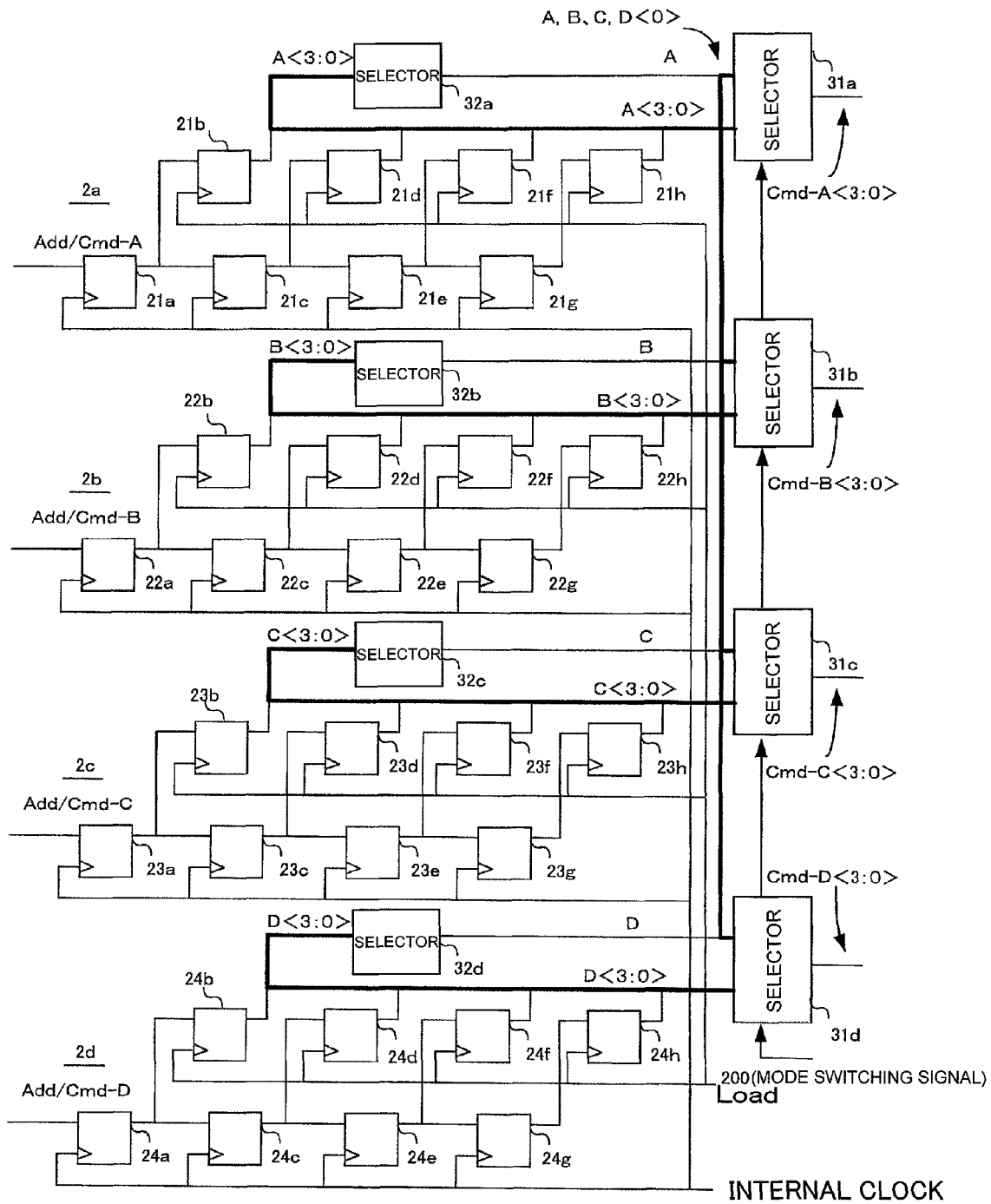
FIG. 7 is an internal configuration diagram of an S/P converter according to a second embodiment of the present invention.

An S/P converter at each port in a semiconductor memory according to a second embodiment of the present invention is specifically shown in FIG. 7. Like constituent elements shown in FIG. 1 are denoted by like reference numerals and explanations thereof will be omitted.

In the second embodiment, in a second operation mode, a register capable of fetching as a valid bit can be selected. For this purpose, in the internal circuit of the S/P converter of the second embodiment, selectors 32a to 32d are arranged. The selectors 32a to 32d are connected to a command bus line connected with the output terminals of the four registers at an upper stage. When the selectors 32a to 32d are operated, the bit information stored in an arbitrary register can be taken out and outputted as a valid bit.

Thus, according to the second embodiment, when the original command/address signal is inputted to the four command/address signal input terminals, the inside of the semiconductor memory device can be operated by the normal clock, only the input frequency of the command/address signal is decelerated to ¼. Further, the bit information stored in the arbitrary register within the S/P converter can be used as a valid bit by operation of the selectors 32a to 32d.

Accordingly, in the second operation mode that is started as a test mode, when the registers 21b, 21d, 21f, and 21h in the S/P converter 2a, for example, are selected sequentially, the test operation is executed. In this way, the operation for these registers can be also checked. The select signals to the selectors 32a to 32d can be arranged within the mode controlling circuit 110 (FIG. 1), and the information can be set from a tester by increasing the number of mode switching signals supplied via the mode signal terminal MD.

<Application Example>

In the above descriptions, the second operation mode is used for testing the semiconductor memory. However, either the second operation mode or first operation mode is used as a normal operation mode to establish various types of systems.

Figure 8:
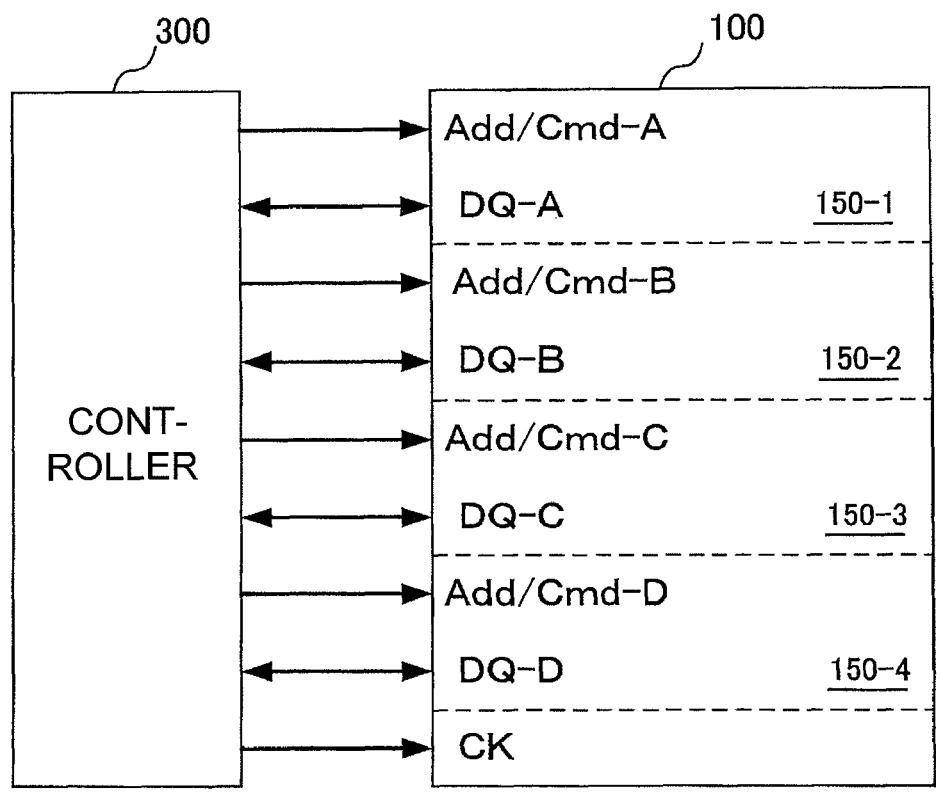
FIG. 8 shows an example of a system configuration according to an application example.

FIG. 8 is a system diagram in which the semiconductor memory 100 shown in FIG. 1 is used as the first operation mode.

That is, a controller 300 as a master device for a memory controller or an MCU/MPU is connected to each terminal of the semiconductor memory 100 to each other. The semiconductor memory 100 is used as the first operation mode, and also an initial state of the semiconductor memory 100 is set as the first operation mode. Thus, it is not necessary to supply a mode switching signal from the controller 300 to the semiconductor memory 100.

In this case, the operation of the semiconductor memory 100 is equivalent to that in FIG. 3A and FIG. 4. Thus, the controller 300 can treat each of the ports 150-1 to 150-4 as an independent port, and can independently execute data reading or writing on an arbitrary address of each port 150.

Figure 9:
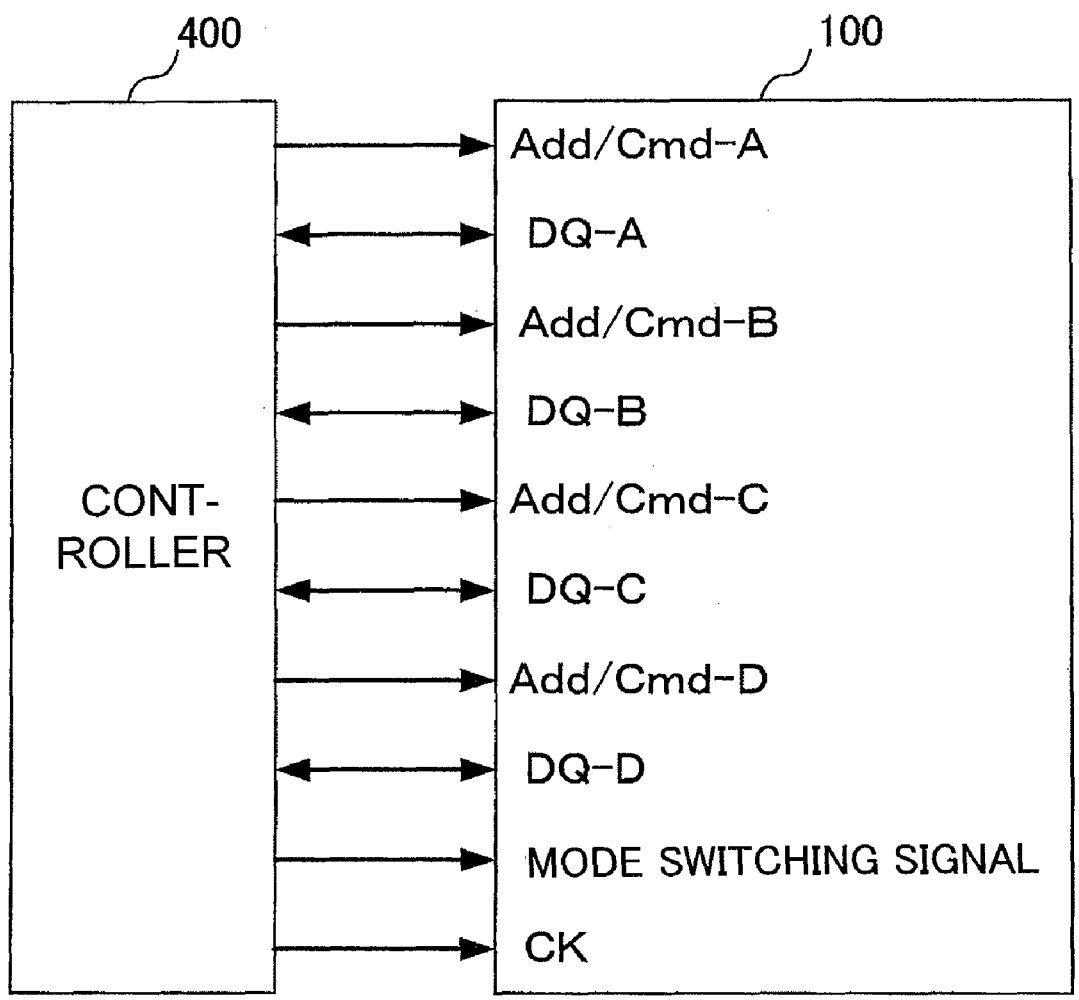
FIG. 9 shows another example of a system configuration according to the application example.

The original form of usage of the semiconductor memory as a multiport includes the configuration shown in FIG. 8. However, depending on a system to be established, there can be also a system of which the number of data bits per each address command packet is desirably 64 bits (16 bits ×4). In this case, as shown in FIG. 9, a controller 400 is connected to the semiconductor memory 100 and supplies the mode switching signal supplied via the mode signal terminal MD to the semiconductor memory 100, thereby setting the second operation mode.

Thus, the controller 400 operates equivalently to that in FIG. 3B and FIG. 5, and supplies the control information of the address/command to the semiconductor memory 100 at a speed lower than that of the internal clock of the semiconductor memory 100, thereby communicating data of a total of 64 bits per each packet with the semiconductor memory 100, via the data terminals DQ-A to the data terminal DQ-D. At this time, a data communication controlling circuit that is started at the time of the test operation described with reference to FIG. 6 is inactivated as a normal operation mode.

Thus, the system includes a controller 400, being a master device, and the semiconductor memory 100, being a slave device, which receives the control information of n bits (in the second embodiment, 16 bits) from the master device 400 to perform data communication with the master device 400. The slave device includes m (four in the second embodiment) serial ports (Add/Cmd-A to Add/Cmd-D) each of which serially receives the information. The master device 400 divides the n-bit control information into each m bits (that is, divides into each four bits), and also uses each of the m serial ports of the slave device to supply the n-bit control information to the slave device in n/m portions.

Each of them serial ports of the slave device 100 fetches at least one piece of valid information from the m-bit-unit data group at each time the m-bit-unit data group is inputted for sharing, and internally generates the n-bit control information.

Further, the controller 400 can use the first operation mode and the second operation mode together. That is, in the system configuration diagram in FIG. 9, the controller 400 operates the semiconductor memory 100 in the first operation mode in a certain address range to perform the data read/write transfer by an independent address on each of the four ports 150-1 to 150-4. In another address range, the controller 400 can switch the semiconductor memory 100 to the second operation mode to execute data processing by greatly increasing the data bit number per each address.

Thus, the system is a data processing system including the master device 400 and the semiconductor device 100 connected to the master device 400. The semiconductor device 100 includes a plurality of circuit units 150-1 to 150-4 each of which has a serial port and executes a predetermined operation based on the n-bit information inputted from outside. At least one of the circuit units includes the first operation mode in which the n-bit information is inputted via its own serial port and the second operation mode in which the n-bit information is inputted via the own serial port and also a serial port of another circuit unit. The first operation mode and the second operation mode are switched according to the mode designation information issued by the master device 400.

Accordingly, as described above, when the semiconductor device is the semiconductor memory 100, the master device 400 issues the mode designation information and designates the first operation mode or the second operation mode for each address region of the semiconductor memory 100, thereby achieving expandability and convenience for the system.

While an embodiment of the present invention has been described with reference to the drawings, specific configurations are not limited to the embodiment, and designs or the like within the scope of the invention are also embraced in the present invention. In the first and second embodiments, an example in which by inputting the command/address signal to the four command/address signal input terminals, the inside of the semiconductor memory device is operated by the normal clock while only the input frequency of the command/address signal is decelerated to ¼ has been described. However, only input frequency of the command/address signal can be decelerated to ½, for example. In this case, as compared to the ¼ frequency, it is probable that a high-speed tester is needed. However, as far as the test environment is prepared, the number of tests can be reduced from four to two.

When the second operation mode is used as one mode of the normal operation, the development of the system configuration is greatly expanded.

Further, while switching of the operation modes is performed by a dedicated terminal, it can be also performed by commonly using one portion of other terminals such as a command/address terminal and a data terminal. It is needless to say that the number of each terminal of the address, command, and data can be changed as appropriate.

What is claimed is:

1. A semiconductor device comprising a plurality of ports each of which includes a control terminal and a data terminal, wherein
in a first operation mode, each of the ports receives control information configured to execute data transmission/reception through its own data terminal, via its own control terminal, and
in a second operation mode, each of the ports receives the control information configured to execute data transmission/reception through its own data terminal, via its own control terminal and also at least one of the control terminals of the other ports.

2. The semiconductor device as claimed in claim 1, wherein in the second operation mode, pieces of valid information are fetched from a data group relating to the control information that is received by using its own control terminal and also at least one of the control terminals of the other ports, and the pieces of valid information are combined to generate the control information.

3. The semiconductor device as claimed in claim 1, wherein
each of the ports includes a memory cell array having a plurality of memory cells, and
the control information includes an address signal for selecting at least one of the memory cells.

4. The semiconductor device as claimed in claim 3, wherein
each of the ports further includes a row address buffer and a column address buffer, and
the address signal includes a row address supplied to the row address buffer and a column address supplied to the column address buffer.

5. The semiconductor device as claimed in claim 4, wherein the control information further includes a command signal for controlling the row address buffer and the column address buffer.

6. The semiconductor device as claimed in claim 1, further comprising a mode controlling circuit bringing the plurality of ports into one of the first operation mode and the second operation mode.

7. The semiconductor device as claimed in claim 6, wherein each of the ports includes a serial/parallel converter that serially receives the control information from its own control terminal.

8. The semiconductor device as claimed in claim 7, wherein each of the serial/parallel converters converting serially inputted control information via its own control terminal into a parallel signal in the first operation mode.

9. The semiconductor device as claimed in claim 7, wherein the serial/parallel converters generate a parallel signal based on the control information supplied in parallel to the control terminals.

10. A data processing system comprising:
a master device; and
a semiconductor device connected to the master device, wherein
the semiconductor device includes a plurality of circuit units each of which includes a serial port and executes a predetermined operation based on n-bit information inputted from outside,
at least one of the circuit units includes a first operation mode in which the n-bit information is inputted via its own serial port and a second operation mode in which the n-bit information is inputted via the own serial port and also a serial port of another circuit unit, and
the first operation mode and the second operation mode are switched according to mode designation information issued by the master device.

11. The data processing system as claimed in claim 10, wherein
the semiconductor device is a semiconductor memory, and
the master device issues the mode designation information to designate the first operation mode or the second operation mode for each address region of the semiconductor memory.

12. A semiconductor device comprising:
a serial port; and
an input circuit that generates operation controlling information from information supplied to the serial port, wherein
the input circuit includes a first operation mode in which information appearing at the serial port in a first cycle is treated as valid information to generate the operation controlling information, and a second operation mode in which information appearing at the serial port in a second cycle different from the first cycle as valid information to generate the operation controlling information.

13. The semiconductor device as claimed in claim 12, wherein
the input circuit is connected with a plurality of temporary memory circuits corresponding to number of bits inputted to the serial port,
the first cycle is a cycle in which the information is sequentially stored in the temporary memory circuits in synchronism with an internal clock, and in a subsequent internal clock in which the information is stored in all of the temporary memory circuits, all pieces of the information stored in the temporary memory circuits are fetched as the valid information, and
the second cycle is a cycle in which, in the subsequent internal clock in which the pieces of the information are stored in all of the temporary memory circuits, out of the pieces of the information stored in the temporary memory circuits, at least one piece of the information is fetched as the valid information.

14. A data processing system comprising:
a master device; and
a slave device that receives n-bit control information from the master device to perform data communication with the master device, wherein
the slave device includes m(m<n) serial ports each of which serially receives the control information, and the master device divides the n-bit control information into each m bits, and also uses each of the m serial ports of the slave device to supply the n-bit control information to the slave device in n/m portions.

15. The data processing system as claimed in claim 14, wherein the m serial ports of the slave device respectively fetches and shares at least one piece of valid information from an m-bit-unit data group each time the m-bit-unit data group is inputted, and internally generates the n-bit control information.

* * * * *